United States Patent
Akahori et al.

(10) Patent No.: US 9,291,643 B2
(45) Date of Patent: Mar. 22, 2016

(54) CURRENT APPLYING DEVICE HAVING PRESSING BODY AND CONTACT BODY

(71) Applicant: HONDA MOTOR CO., LTD., Tokyo (JP)

(72) Inventors: Shigeto Akahori, Tochigi (JP); Hiroyuki Yamagishi, Yochigi (JP); Satoshi Hasegawa, Tochigi (JP); Yoko Yamaji, Tochigi (JP); Nobuo Kambara, Tochigi (JP); Shinyu Hirayama, Tochigi (JP)

(73) Assignee: HONDA MOTOR CO., LTD., Tokyo (JP)

(*) Notice: Subject to any disclaimer, the term of this patent is extended or adjusted under 35 U.S.C. 154(b) by 188 days.

(21) Appl. No.: 13/935,786

(22) Filed: Jul. 5, 2013

(65) Prior Publication Data

US 2014/0015558 A1    Jan. 16, 2014

(30) Foreign Application Priority Data

Jul. 11, 2012  (JP) .................................. 2012-155896
Mar. 7, 2013   (JP) .................................. 2013-045791

(51) Int. Cl.
G01R 31/00     (2006.01)
G01R 1/067     (2006.01)
G01R 1/073     (2006.01)
G01R 3/00      (2006.01)
G01R 31/28     (2006.01)

(52) U.S. Cl.
CPC ............ *G01R 1/067* (2013.01); *G01R 1/07314* (2013.01); *G01R 3/00* (2013.01); *G01R 31/2891* (2013.01)

(58) Field of Classification Search
None
See application file for complete search history.

(56) References Cited

U.S. PATENT DOCUMENTS

| | | | |
|---|---|---|---|
| 5,420,520 A * | 5/1995 | Anschel et al. | 324/750.05 |
| 5,483,741 A | 1/1996 | Akram et al. | |
| 6,524,115 B1 * | 2/2003 | Gates et al. | 439/66 |
| 7,049,837 B2 * | 5/2006 | Kasukabe et al. | 324/754.07 |
| 7,145,354 B2 * | 12/2006 | Stillman | 324/754.2 |
| 8,102,184 B2 * | 1/2012 | Sherry et al. | 324/754.03 |
| 2004/0070413 A1 | 4/2004 | Kasukabe et al. | |
| 2013/0009658 A1 | 1/2013 | Nishikawa | |

FOREIGN PATENT DOCUMENTS

| | | |
|---|---|---|
| CN | 1512186 | 7/2004 |
| JP | 10-506196 | 6/1998 |
| JP | 2001-052779 | 2/2001 |
| JP | 2007-218675 | 8/2007 |
| JP | 2012-068076 | 4/2012 |
| JP | 2012-88298 | 5/2012 |

OTHER PUBLICATIONS

Japanese Office Action, date of mailing Jun. 10, 2014.
Chinese Office Action dated Jul. 1, 2015, 7 pages.

* cited by examiner

*Primary Examiner* — Minh N Tang
(74) *Attorney, Agent, or Firm* — Rankin, Hill & Clark LLP

(57) ABSTRACT

A current applying device is provided in which a contact body which surface-contacts with an inspection target body makes contact with the surface of the inspection target body uniformly; current can be favorably applied from the contact body to the inspection target body; and the contact body alone can be replaced. A probe device 1 for applying current by being in pressure-contact with the power semiconductor H includes: a contact body 2 which surface-contacts with the power semiconductor H; and a plurality of electrically-conductive two-tier springs 31 which press the contact body 2 onto the power semiconductor H; the contact body 2 and the plurality of electrically-conductive two-tier springs 31 are separate bodies, and the plurality of electrically-conductive two-tier springs 31 electrify the contact body 2 while providing pressing force F to each of a plurality of sections of the contact body 2.

7 Claims, 5 Drawing Sheets

CURRENT APPLYING DEVICE HAVING PRESSING BODY AND CONTACT BODY

This application is based on and claims the benefit of priority from Japanese Patent Application No. 2012-155896, filed on 11 Jul. 2012 and Japanese Patent Application No. 2013-045791, filed on 7 Mar. 2013 the content of which is incorporated herein by reference.

BACKGROUND OF THE INVENTION

1. Field of the Invention

The present invention relates to a current applying device for use in a probe device, such as a semiconductor inspection device.

2. Related Art

A probe that serves as a current applying device and is used when inspecting the characteristics of an inspection target body is known heretofore (for example, see Patent Document 1).

The probe disclosed in Patent Document 1 includes: a rod-shaped base material which forms a main part; nickel plating layer, which is a foundation layer, and a gold plating layer, which is an outermost layer, formed on a surface of the base material; and a plurality of square cone-shaped projections which contact with an inspection target body and which are formed in a grid form at one end of the base material.

According to the above-described probe, the load applied when contacting the inspection target body can be distributed uniformly and the progress of abrasion of the gold plating layer can be delayed, and as a result, contact stability of the probe and lifespan can be prolonged effectively.

Patent Document 1: Japanese Unexamined Patent Application, Publication No. 2007-218675

SUMMARY OF THE INVENTION

However, in the probe disclosed in Patent Document 1, a plurality of square cone-shaped projections that contact with the inspection target body touch a surface of the inspection target body unevenly, and therefore there are cases where the plurality of square cone-shaped projections cannot contact with the surface of the inspection target body uniformly.

In addition, the entire probe needs to be replaced when the plurality of square cone-shaped projections are abraded.

The present invention is for solving the above-described issues. An object is to provide a current applying device in which a contact body, which surface-contacts with the inspection target body, makes contact with the surface of the inspection target body uniformly; current can be favorably applied from the contact body to the inspection target body; and the contact body alone can be replaced.

(1) A current applying device (e.g., a probe device 1, 1a and 1b described below) for applying current by being in pressure-contact with an inspection target body (e.g., a power semiconductor H described below), comprising: a contact body (e.g., a contact body 2 described below) which surface-contacts with the inspection target body; and a pressing body (e.g., a pressing body 3 described below) which presses the contact body to the inspection target body; the contact body and the pressing body being separate bodies, and the pressing body electrifying the contact body while providing pressing force (e.g., a pressing force F described below) to each of a plurality of sections of the contact body.

According to (1), the pressing body provides pressing force to each of the plurality of sections of the contact body and makes contact surface pressure to the surface of the inspection target body of the contact body uniform. Thereby, the contact body can contact with the surface of the inspection target body uniformly. Then, since the pressing body is pressed to the contact body uniformly and contacts with the entire contact body, current is favorably supplied to the contact body. Therefore, current can be favorably applied to the inspection target body from the contact body.

In addition, since the contact body and the pressing body are separate bodies, replacement of only the contact body, which has a short lifespan, is possible, thus reducing cost.

(2) The current applying device according to (1), wherein the pressing body includes a plurality of electrically-conductive elastic bodies (e.g., an electrically-conductive two-tier spring 31 and an electrically-conductive spring 32 described below).

According to (2), the pressing body includes a plurality of electrically-conductive elastic bodies which give pressing force to a plurality of sections of the contact body, respectively; and a plurality of electrically-conductive elastic bodies balance the pressing force and contraction by each conductive elastic body, adjust parallelism with the surface of the contact body and the inspection target body, and make uniform contact pressure to the surface of the inspection target body of the contact body. Thereby, the contact body can contact with the surface of the inspection target body uniformly. In addition, the plurality of electrically-conductive elastic bodies move flexibly to the bending direction of each spring and thus displacement of the contact position to the contact body and bending are allowed. Thereby, the contact state with respect to the surface of the inspection target body of the contact body is not affected by the displacement of the contact position to the contact body or bending. In addition, since the plurality of electrically-conductive elastic bodies are pressed to the contact body uniformly and contact with the entire contact body, current is favorably supplied to the contact body. Therefore, current can be favorably applied from the contact body to the inspection target body. In addition, since the contact body and the plurality of electrically-conductive elastic bodies are separate bodies, replacement of only the contact body, which has a short lifespan, is possible, thus reducing cost.

(3) The current applying device according to (1) or (2), wherein the contact body includes a surface layer (e.g., a nickel layer 21 described below) that contacts with the inspection target body, and a supporting layer (e.g., a copper layer 22 described below) that supports the surface layer, and the supporting layer is more flexible than the surface layer.

According to (3), the supporting layer of the contact body is more flexible than the surface layer and distributes the pressing force applied to the section further. Thereby, the contact body can contact the surface of the inspection target body more uniformly and reliably.

(4) The current applying device according to any one of (1) to (3), wherein the contact body has microscopic projections (e.g., microscopic projections 23 described below) that are inserted into only a surface layer of the inspection target body on a surface that contacts with the inspection target body.

According to (4), the contact body has the microscopic projections that are inserted into only the surface layer of the inspection target body on the surface that contacts with the inspection target body. Thereby, the contact body can apply current to the inspection target body reliably in a state where the microscopic projections are inserted into the surface layer. In addition, the microscopic projections s are inserted into only the surface layer of the inspection target body and do not damage the inspection target body itself.

(5) The current applying device according to (4), wherein the contact body having the microscopic projections is manufactured by electroforming using a mold (e.g., a mold 11 described below) in which depressions (e.g., depressions 111 described below) corresponding to the microscopic projections are formed on a surface (for example, a surface 11*f*, described below).

Here, electroforming is a method for manufacturing or duplicating a metal product with an electroplating method.

According to (5), the contact body having the microscopic projections is manufactured by electroforming, using the mold in which the depressions corresponding to the microscopic projections are formed on the surface. Thereby, it is possible to manufacture a contact body as designed, which has microscopic projections that are made by transferring depressions formed in the mold accurately. Therefore, the microscopic projections have a shape as designed, and are inserted into only the surface layer of the inspection target body.

(6) The current applying device according to (4) or (5), wherein the height of the microscopic projections from the surface of the contact body is smaller than a film thickness of a surface electrode layer formed on a surface of a power semiconductor (e.g., a power semiconductor H described below) which is to be inspected as an inspection target body.

According to (6), the height of the microscopic projections from the surface is smaller than the film thickness of the surface electrode layer formed on the surface of the power semiconductor, which is the inspection target body. Therefore, the contact body can apply current to the power semiconductor reliably in a state where the microscopic projections are inserted into the surface electrode layer. In addition, the microscopic projections are inserted into only the surface electrode layer of the power semiconductor and thus do not damage the power semiconductor itself.

(7) The current applying device according to (6), wherein the surface of the contact body has a regulating surface (e.g., a surface 2*f* described below) which regulates introduction of the microscopic projections into the surface electrode layer.

According to (7), the surface of the contact body has a regulating surface which regulates the introduction of the microscopic projections into the surface electrode layer. Thereby, the regulating surface can regulate excess introduction of the microscopic projections into the surface electrode layer even if pressure is further applied after the microscopic projections are inserted into the surface electrode layer of the power semiconductor.

According to the present invention, it is possible to provide a current applying device in which a contact body which surface-contacts with an inspection target body makes contact with the surface of an inspection target body uniformly; current can be favorably applied from the contact body to the inspection target body; and the contact body alone can be replaced.

DETAILED DESCRIPTION OF THE INVENTION

Embodiments of the present invention will be described below with reference to the drawings.

First Embodiment

Figures 1A, 1B:
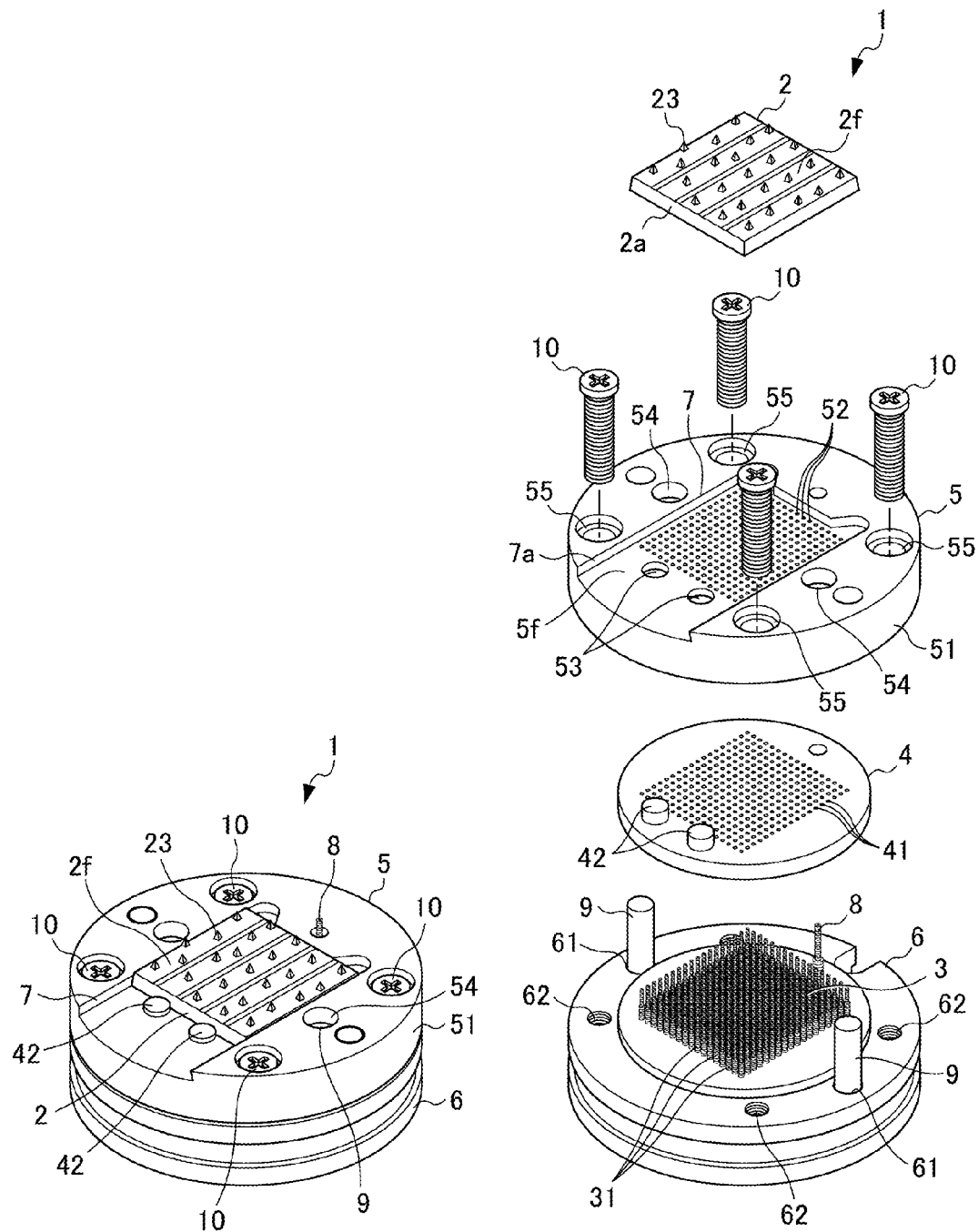
FIGS. 1A and 1B are perspective views showing a schematic structure of a probe device according to a first embodiment of the present invention.

FIGS. 1A and 1B are perspective views showing a schematic structure of a probe device 1 which serves as a current applying device according to a first embodiment of the present invention. FIG. 1A is an overall view and FIG. 1B is an exploded view.

The probe device 1 shown in FIGS. 1A and 1B is used in semiconductor inspection devices for inspecting a power semiconductor (e.g. IGBT, MOS, and diode) H (see FIG. 4) used for switching a large amount of current, 400-2000 A, and applies a large amount of current by being pressed against the power semiconductor H.

The probe device 1 includes a contact body 2, a pressing body 3, a release plate 4, a first latching plate 5, and a substrate 6.

As shown in FIGS. 1A and 1B, the contact body 2 has a surface 2*f* which is formed in a quadrangular shape somewhat smaller than the quadrangular-shaped power semiconductor H, and which surface-contacts with the power semiconductor H.

Figure 2:
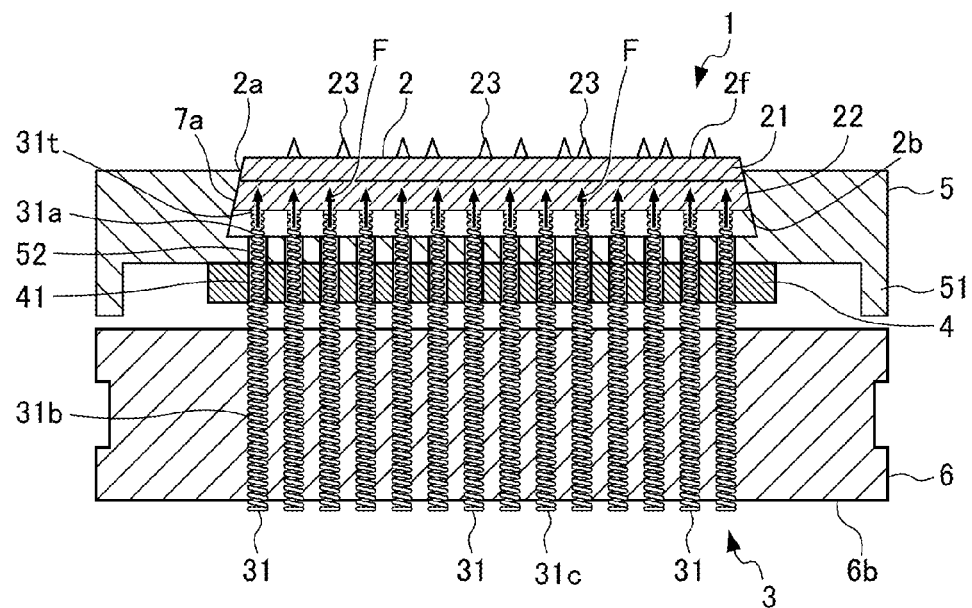
FIG. 2 is a cross-sectional view showing a schematic structure of the probe device according to the embodiment.

FIG. 2 is a cross-sectional view showing a schematic structure of the probe device 1. The contact body 2 includes: a nickel layer 21 (outer layer) which has a surface 2*f* that contacts with the power semiconductor H; and a copper layer 22 (supporting layer) which has a back surface 2*b* that contacts with a pressing body 3 described below and supports the nickel layer 21. Here, since copper is a metal that is softer than nickel, the copper layer 22 is more flexible than the nickel layer 21. The thickness of the nickel layer 21 of the contact body 2 is 0.3 mm, for example. In addition, the thickness of the copper layer 22 is 0.7 mm, for example.

The contact body 2 has a plurality of microscopic projections 23 which are inserted into only the surface electrode layer of the surface layer of the power semiconductor H on the surface 2*f*. Although the contact body 2 has the plurality of microscopic projections 23, the surface 2*f* is a wide flat surface as compared with the plurality of microscopic projections 23.

The pressing body 3 includes an electrically-conductive two-tier spring 31 which is a separate object from the contact body 2 and forms a plurality of electrically-conductive elastic bodies (multiple parts). An extremity surface 31*t* of the electrically-conductive two-tier spring 31 contacts with the back surface 2*b* of the contact body 2 and its contact position is movable. As shown in FIG. 2, the electrically-conductive two-tier springs 31 are arranged at equal intervals (for example, a 20×20 arrangement) on the back surface 2*b* of the contact body 2 in an XY plane direction, and apply a pressing force F to each of the plurality of sections of the contact body 2.

The electrically-conductive two-tier spring 31 is a spring component including: a small diameter part 31*a* having an extremity surface 31t; and a large diameter part 31b at the base end portion side having a larger diameter than the small diameter part 31a.

The electrically-conductive two-tier spring 31 may be formed by overlapping a spring having the same diameter as the large diameter part 31b side on a spring that has the same diameter as the small diameter part 31a and extends to the base end portion, from the base end portion to a boundary between the large diameter part 31b and the small diameter part 31a. In addition, the small diameter part 31a and the large diameter part 31b may be connected to the spring in a boundary portion between the large diameter part 31b and the small diameter part 31a.

It should be noted that, although the electrically-conductive two-tier spring 31 having electrical conductivity is used for all of the pressing body 3 in this embodiment, electrical conductivity may be given only to a part of the springs of the pressing body 3 when there is enough electricity conducted by the pressing body 3. For example, in the plurality of springs which are arranged adjacently to serve as the pressing body 3, springs that have electrical conductivity and springs that do not have electrical conductivity may be arranged alternately one by one.

In addition, if electricity for electrifying the contact body 2 is not enough by merely making the spring of the pressing body 3 electrically-conductive, flexible wiring may be formed separately to electrify the contact body 2 directly.

The release plate 4 is disc-shaped, and a plurality of through-holes 41 (for example, 20×20 holes) that pass through in the thickness direction are formed in the release plate 4. Only the small diameter part 31a of each of the plurality of electrically-conductive two-tier springs 31 which press the contact body 2 from the back surface 2b is pushed through the plurality of through-holes 41. Preferably, the plurality of through-holes 41 are arranged at the same position as the electrically-conductive two-tier spring 31, and the inner surface of the plurality of through-holes 41 is formed to have a smooth surface such that the small diameter part 31a can move smoothly inside the through-hole 41.

In the release plate 4, the large diameter part 31b of the electrically-conductive two-tier spring 31 contacts with the peripheral edge of the through-hole 41 without being inserted into the through-holes 41, and the release plate 4 is pressed onto the first latching plate 5 by the electrically-conductive two-tier spring 31.

The release plate 4 has two buttons 42 adjacent to the through-holes 41.

The first latching plate 5 has a disc-shape and has a wall portion 51, which projects to the substrate 6 side, at the peripheral edge, and when the probe device 1 is installed, the first latching plate 5 locates at the extremity of the probe device 1 and surrounds the release plate 4.

There is a slider 7, which is set back as compared to its surroundings, and which latches the contact body 2 on the side surface, in the central region of the surface 5f of the first latching plate 5.

The slider 7 is formed in a Π shape and has substantially the same width as the width of the quadrangular-shaped contact body 2, and a pair of sides is opened to the side surface of the first latching plate 5. As shown in FIG. 2, the side faces of both the slider 7 and the contact body 2 are formed as tapered parts 7a and 2a, narrowing towards the power semiconductor H side. Therefore, when the contact body 2 is pressed by a plurality of electrically-conductive two-tier springs 31, the tapered part 2a of the side surface contacts with the tapered part 7a of the side surface of the slider 7 in the first latching plate 5 and the contact body 2 is latched by the first latching plate 5.

The surface 2f of the contact body 2 in this latched state projects more than the first latching plate 5, and is set in a state where the contact body 2 can initially contact with the power semiconductor H first.

Thereby, the contact body 2 is held so that it can rock, such that the contact body 2 surface-contacts with the surface of the power semiconductor H on the entire surface uniformly, between the plurality of electrically-conductive two-tier springs 31 and the first latching plate 5.

This latched state is preferable for having the contact body 2 in a standby state, in order to fix the rockable contact body 2 and regulate unnecessary rocking of the contact body 2.

A plurality of through-holes 52 which pass through in the thickness direction (for example, 20×20 holes) are formed in the first latching plate 5 in a region surrounded by the slider 7. Only the small diameter part 31a of each of the plurality of electrically-conductive two-tier springs 31 that press the contact body 2 from the back surface 2b is inserted through the plurality of through-holes 52. Preferably, the plurality of through-holes 52 are arranged at the same position as the electrically-conductive two-tier spring 31 and the inner surface of the plurality of through-holes 52 is formed to have a smooth surface such that the small diameter part 31a can move smoothly inside the through-holes 41.

The first latching plate 5 has two button holes 53 in a region surrounded by the slider 7 and adjacent to the plurality of through-holes 52.

When the probe device 1 is installed, the release plate 4 is pressed onto the first latching plate 5 by the large diameter part 31b of the electrically-conductive two-tier spring 31 and the two buttons 42 on the release plate 4 project from the two button holes 53 in the first latching plate 5.

When the two buttons 42 are pressed down, the release plate 4 presses down the large diameter part 31b of the electrically-conductive two-tier spring 31, and the extremity surface 31t of the electrically-conductive two-tier spring 31 moves in the direction of the opening of the through-hole 52 of the surface 5f of the first latching plate 5, the contact between the tapered parts 7a and 2a is canceled, and the contact body 2 moves away from the first latching plate 5. In this state, it is possible to remove the contact body 2 by sliding the contact body 2 from the opened side of the slider 7 in a lateral direction and to replace the contact body 2 without interfering with other components.

In the contact body 2, the plurality of microscopic projections 23 are abraded by being inserted into the surface electrode layer in the surface layer of the power semiconductor H and therefore the lifespan of the contact body 2 is shorter than other components. Therefore, it is advantageous that the contact body 2 alone can be replaced separately from other components.

The substrate 6 has a disc-shape and is somewhat larger than the release plate 4. The substrate 6 fixes the base end portion of the large diameter part 31b of the plurality of electrically-conductive two-tier springs 31. A bottom end 31c of the base end portion of the electrically-conductive two-tier spring 31 projects from the back surface 6b side of the substrate 6 and is connected to a current supply source (not illustrated).

The substrate 6 is connected to a cylinder (not illustrated) arranged at the back side, and the cylinder presses the probe device 1 onto the power semiconductor H.

A gate terminal 8 is provided in the substrate 6 independently from the electrically-conductive two-tier spring 31.

The gate terminal 8 inputs, into the power semiconductor H, signals for on and off control of the power semiconductor H.

The gate terminal 8 has an expanding and contracting function as in the electrically-conductive two-tier spring 31, and projects to the extremity side of the probe device 1 as in the contact body 2. The gate terminal 8 is connected to a signal circuit (not illustrated), and the gate terminal 8 itself similarly contacts with the power semiconductor H when the contact body 2 presses the power semiconductor H, and performs on and off control of the power semiconductor H when a signal voltage is input.

In the substrate 6 and the first latching plate 5, there are two alignment bolt holes 61 and 54 provided around the center region where the contact body 2 is arranged, and alignment bolts 9 inserted into the alignment bolt holes 61 and 54; and alignment is performed using the two alignment bolt holes 61 and 54 and the alignment bolts 9.

In the substrate 6 and the first latching plate 5, there are four first bolt holes 62 and 55 provided at the outer side of the release plate 4; and first bolts 10 which are inserted into the first bolt holes 62 and 55. These are used for fixing the substrate 6 and the first latching plate 5 with a gap as a result of the wall portion 51 of the first latching plate 5, and the release plate 4 can be held between the substrate 6 and the first latching plate 5.

Next, a method for manufacturing the contact body 2 will be described.

The contact body 2 having the microscopic projections 23 is manufactured by electroforming, using a mold 11 in which depressions 111 corresponding to the microscopic projections 23 are formed on the surface 11*f*.

Figure 3:
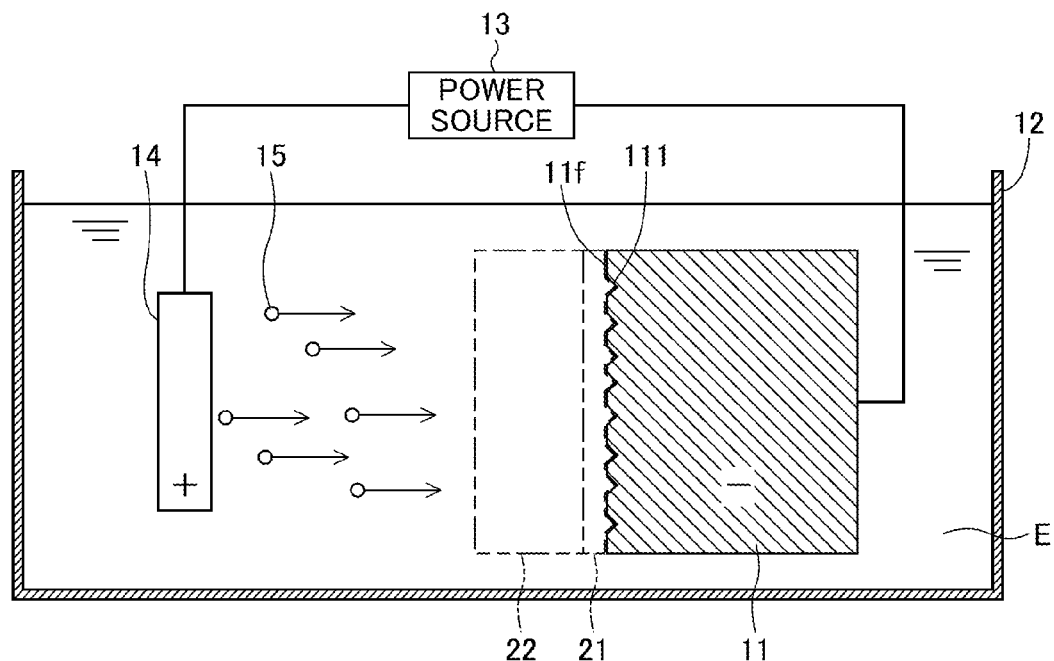
FIG. 3 is a diagram for illustrating a method for manufacturing a contact body by electroforming according to the above-described embodiment.

FIG. 3 is a diagram for illustrating the method for manufacturing the contact body 2 by electroforming according to the present embodiment.

Specifically, first, there is provided the mold 11 in which a plurality of depressions 111 corresponding to the plurality of microscopic projections 23 are formed on the surface 11*f*.

Next, as shown in FIG. 3, metal ions 15 supplied from a positive electrode 14 are electrodeposited by setting the mold 11 as a negative electrode in a solution E in the container 12 and connecting the negative electrode and the positive electrode 14 via a power source 13. Initially, since it is necessary to form the plurality of microscopic projections 23 corresponding to the plurality of depressions 111 formed in the mold 11, nickel ions are electrodeposited on the surface 11*f* of the mold 11, which is a negative electrode. Next, in order to form a copper layer 22 on the mold 11 where a nickel layer 21 is electrodeposited, copper ions are electrodeposited on the mold 11, which is a negative electrode.

Then, the surface (back surface 2*b* of the contact body 2 having the microscopic projections 23) of the copper layer 22 of the contact body 2 manufactured by electroforming is subjected to surface treatment to have a flat surface such that a pressing force F due to the plurality of electrically-conductive two-tier springs 31 does not change. In addition, the tapered part 2*a* is formed in the side surface of the contact body.

Thus, the contact body 2 is manufactured.

Here, the plurality of microscopic projections 23 need to be formed with a height smaller than about 10 micrometers so as not to perforate a surface electrode layer with a film thickness of about 10 micrometers which is formed on the surface of the power semiconductor H. In addition, the plurality of microscopic projections 23 need to be formed with height larger than about 0.1 micrometer so as to perforate an insulating oxide film with a film thickness of about 0.1 micrometers which is formed on the surface of the surface electrode layer.

To address this issue, since electroforming can carry out surface transfer with a precision of units of 0.05-0.1-micrometers, it is possible to form the plurality of microscopic projections 23 having a height smaller than about 10 micrometers, which is the layer thickness of the surface electrode layer, and larger than about 0.1 micrometers, which is the film thickness of an oxide film, into a designed form with good accuracy.

The operation at the time of the inspection of the power semiconductor H by the probe device 1 will be described now.

First, the probe device 1 is pressed onto the power semiconductor H using a cylinder.

The contact body 2 is then pressed onto the power semiconductor H.

Specifically, first, the plurality of microscopic projections 23 are inserted into only the surface electrode layer on the surface layer of the power semiconductor H. Thereby, the plurality of microscopic projections 23 serve as spikes, and the contact body 2 is positioned against the power semiconductor H.

When the probe device 1 is further pressed onto the power semiconductor H using the cylinder, the contact body 2 moves away from the first latching plate 5 and forms a floating state. Then, the electrically-conductive two-tier spring 31 that strongly presses, contracts, and the electrically-conductive two-tier spring 31 that weakly presses, exerts pressing force F, and thus each spring of the electrically-conductive two-tier spring 31 is balanced between the pressing force F and contraction. Thereby, the plurality of electrically-conductive two-tier springs 31 adjust the degree of parallelism between the surfaces of the contact body 2 and the power semiconductor H and make contact pressure to the surface of the power semiconductor H of the contact body 2 uniform. Then, the contact body 2 contacts with the surface of the power semiconductor H uniformly.

Specifically, the contact body 2 is a component in which the entire back surface 2*b* is pressed by the plurality of electrically-conductive two-tier springs 31, and as a result of the behavior of the plurality of electrically-conductive two-tier springs 31 being reflected, the degree of parallelism with the surface of the power semiconductor H is adjusted by the contact body 2 being quickly rocked.

At this time, the probe device 1 may experience horizontal displacement, torsion, vibration, or the like upon being pressed onto the power semiconductor H using the cylinder. For this purpose, the plurality of electrically-conductive two-tier springs 31 move flexibly to the bending direction of each spring, and therefore can absorb the horizontal displacement, torsion, vibration, or the like, produced in the probe device 1, with displacement of the contact position of the extremity surface 31*t* that contacts with the back surface 2*b* of the contact body 2, or bending of the small diameter part 31*a* that projects from the through-hole 52 of the first latching plate 5. Thereby, the contact state with respect to the surface of the power semiconductor H of the contact body 2 is not affected by the horizontal displacement, torsion, vibration, or the like, and the plurality of microscopic projections 23 does not grind the surface of the power semiconductor H as a result of the positional displacement of the contact body 2.

In addition, at this time, the copper layer 22 of the contact body 2 is more flexible than the nickel layer 21 and distributes stress applied to the contact body 2 by each of the plurality of electrically-conductive two-tier springs 31. Thereby, the contact body 2 contacts uniformly and more reliably with the surface of the power semiconductor H. In addition, dispersion of stress as a result of a soft copper layer 22 reduces the degree of abrasion when the plurality of microscopic projections 23 are inserted into the surface electrode layer of the power semiconductor H.

In addition, the surface 2f of the contact body 2 is a flat surface larger as compared to the plurality of microscopic projections 23 and is a regulated surface that regulates introduction of the plurality of microscopic projections 23 into the surface electrode layer. Therefore, even in a case where further pressure is applied to the surface 2f after the plurality of microscopic projections 23 are inserted into the surface electrode layer of the power semiconductor H, the contact state of the surface 2f to the power semiconductor H is maintained and excess introduction of the plurality of microscopic projections 23 into the surface electrode layer is regulated.

Next, an inspection of the power semiconductor H is performed by the current supply source at the back of the substrate 6 supplying a large current to the contact body 2 via the plurality of electrically-conductive two-tier springs 31, and the gate terminal 3 inputting signals for performing on and off control of the power semiconductor H.

The probe device 1 according to the present embodiment described above has the following advantageous effects.

(1) The pressing body 3 includes the plurality of electrically-conductive two-tier springs 31 which apply a pressing force to each of a plurality of sections of the contact body 2, and the plurality of electrically-conductive two-tier springs 31 balance between the pressing force produced by each electrically-conductive two-tier spring 31 and the contraction, so as to have uniform contact pressure on the surface of the power semiconductor H of the contact body 2. Thereby, the contact body 2 can contact with the surface of the power semiconductor H uniformly. In addition, the plurality of electrically-conductive two-tier springs 31 move flexibly to the bending direction of each spring, and displacement of the contact position against the contact body 2 and bending are allowed. Thereby, the contact state with respect to the surface of the power semiconductor H of the contact body 2 is not affected by the displacement of the contact position against the contact body 2 or the bending. In addition, the plurality of electrically-conductive two-tier springs 31 press uniformly against the contact body 2 and then the entire contact body 2 is electrified. Thereby, current is favorably supplied to the contact body 2. Therefore, current can be favorably applied from the contact body 2 to the power semiconductor H.

In addition, the contact body 2 and the plurality of electrically-conductive two-tier springs 31 are configured as different bodies, and thus replacement of only the contact body 2, which has a short lifespan, is possible, thus reducing cost.

(2) The copper layer 22 of the contact body 2 is more flexible than the nickel layer 21 and disperses further each pressing force of the plurality of electrically-conductive two-tier springs 31. Thereby, the contact body 2 can contact with the surface of the power semiconductor H more uniformly and reliably.

In addition, distribution of the pressing force by the soft copper layer 22 reduces the degree of abrasion when the microscopic projections 23 are inserted into the surface electrode layer of the power semiconductor H.

(3) On the surface 2f that contacts with the power semiconductor H, the contact body 2 has the plurality of microscopic projections 23 which have a height from the surface 2f smaller than the film thickness of the surface electrode layer of the power semiconductor H, and are inserted into only the surface electrode layer. Thereby, the contact body 2 can apply current to the power semiconductor H reliably in a state where the plurality of microscopic projections 23 are inserted into the surface electrode layer. In addition, the plurality of microscopic projections 23 are inserted into only the surface electrode layer of the power semiconductor H and therefore do not damage the power semiconductor H itself.

(4) The contact body 2 having the plurality of microscopic projections 23 is manufactured by electroforming, using the mold 11 in which a plurality of depressions 111 corresponding to the plurality of microscopic projections 23 are formed on the surface 11f. Thereby, it is possible to manufacture the contact body 2 as designed, with the plurality of microscopic projections 23 that are made by transferring the plurality of depressions 111 being formed in the mold 11 accurately. Therefore, the plurality of microscopic projections 23 are formed as designed, being inserted into only the surface electrode layer of the power semiconductor H.

(5) The surface 2f of the contact body 2 serves also as a regulating surface that regulates the introduction of the plurality of microscopic projections 23 into the surface electrode layer. The surface 2f, which is a regulating surface, is a flat surface larger than the plurality of microscopic projections 23. Thereby, even if pressure is further applied after the plurality of microscopic projections 23 are inserted into the surface electrode layer of the power semiconductor H, the surface 2f can maintain the contact state against the power semiconductor H and regulate excess introduction of the plurality of microscopic projections 23 into the surface electrode layer.

Second Embodiment

In a second embodiment, although the structure of a probe device 1a is different from that of the first embodiment, since other parts are the same, characterizing portions will be described and descriptions of similar components will be omitted.

Figure 4:
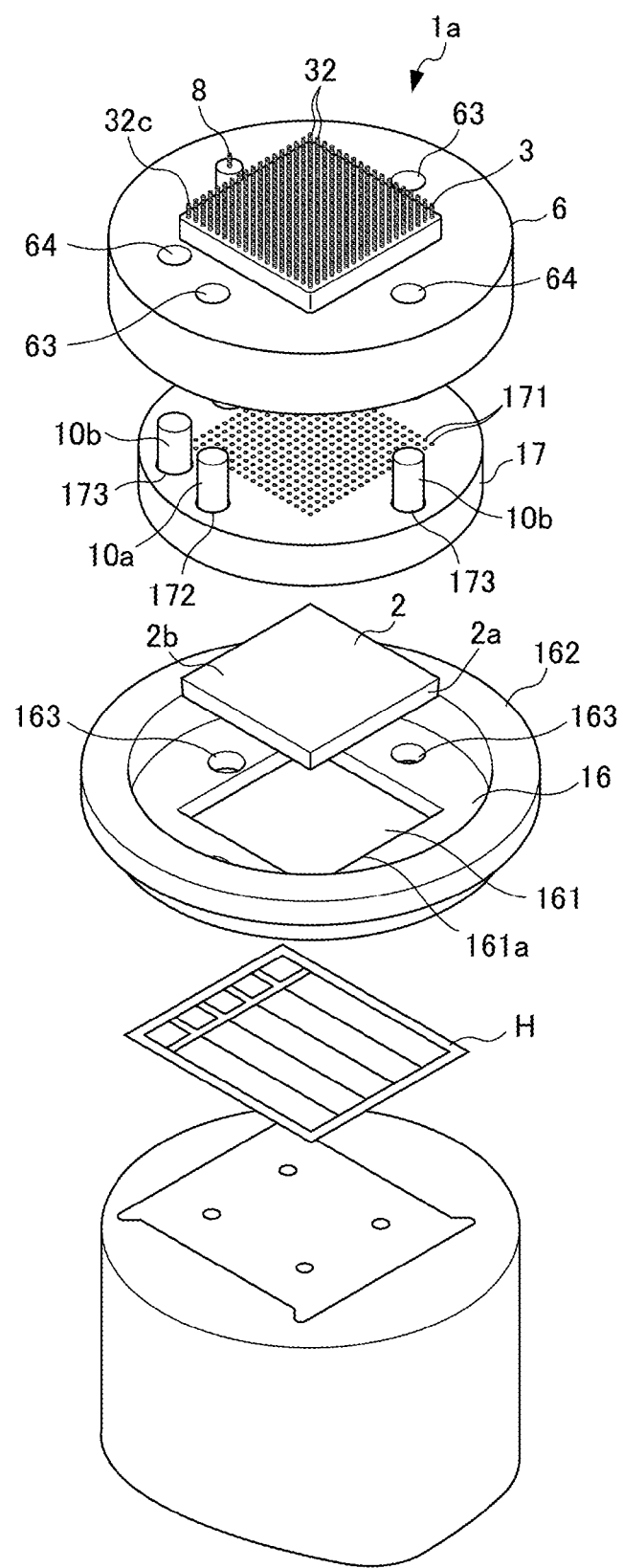
FIG. 4 is a perspective view showing a schematic structure of a probe device according to a second embodiment of the present invention.

FIG. 4 is a perspective view showing a schematic structure of a probe device 1a according to the present embodiment.

The probe device 1a includes a contact body 2, a pressing body 3, a second latching plate 16, a guiding body 17 and a substrate 6.

As shown in FIG. 4, the contact body 2 has a surface 2f which is formed in a quadrangular shape somewhat smaller than a power semiconductor H of quadrangular shape, and has surface-contacts with the power semiconductor H.

Figure 5:
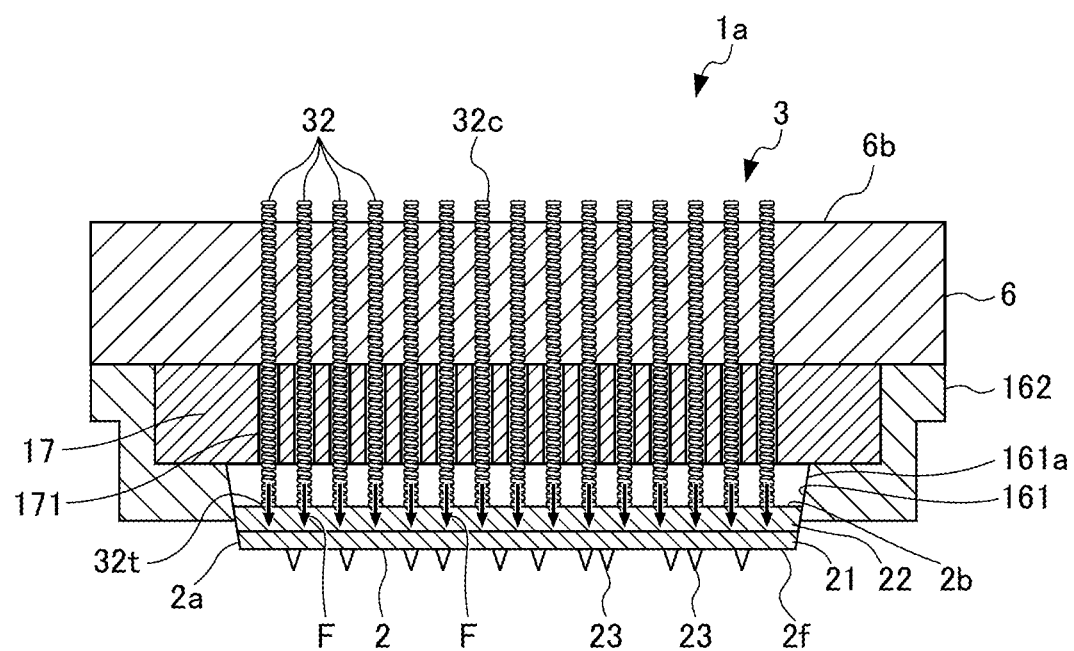
FIG. 5 is a cross-sectional view showing a schematic structure of the probe device according to the above-described embodiment.

FIG. 5 is a cross-sectional view showing a schematic structure of the probe device 1a according to the present embodiment. The contact body 2 includes: a nickel layer 21 (surface layer) having a surface 2f that contacts with the power semiconductor H; and a copper layer 22 (supporting layer) which has a back surface 2b that contacts with the pressing body 3 and supports the nickel layer 21. Here, since copper is a metal that is softer than nickel, the copper layer 22 is more flexible than the nickel layer 21.

On the surface 2f, the contact body 2 has the plurality of microscopic projections 23 that are inserted into only the surface electrode layer of the surface layer of the power semiconductor H. Although the contact body 2 has the plurality of microscopic projections 23, the surface 2f is a flat surface larger than the plurality of microscopic projections 23.

The pressing body 3 has a separate body from the contact body 2 and includes electrically-conductive springs 32 which are a plurality of electrically-conductive elastic bodies (multiple parts). An extremity surface 32t of the electrically-conductive springs 32 is configured to contact with the back surface 2b of the contact body 2 and allow movement of the contact position. The electrically-conductive springs 32 are arranged at equal intervals on the back surface 2b of the contact body 2 in an XY plane direction and apply a pressing force F to each of a plurality of sections of the contact body 2.

It should be noted that, in the present embodiment, although the electrically-conductive springs 32 having electrical conductivity are used in all of the electrically-conductive springs 32, only a part of springs in the pressing body 3 may be electrically-conductive when there is enough electricity conducted by the pressing body 3. For example, in the plurality of springs which are arranged adjacently to serve as the pressing body 3, springs that have electrical conductivity and springs that do not have electrical conductivity may be arranged alternately one by one.

In addition, if electricity for electrifying the contact body 2 is not enough by merely making the spring of the pressing body 3 electrically-conductive, flexible wiring may be formed separately to electrify the contact body 2 directly.

The second latching plate 16 has a disc-shape and has a flange part 162 which extends in the direction of the substrate 6 and extends in an outer radial direction thereafter to the peripheral edge, and is located at the extremity of the probe device 1a when the probe device 1a is installed.

The center region of the surface of the second latching plate 16 has an opening 161 which latches the contact body 2 on the side surface.

The opening 161 is formed in a quadrangular shape of substantially the same shape as the contact body 2. As shown in FIG. 5, side surfaces of both the opening 161 and the contact body 2 are formed to have tapered parts 161a and 2a, tapering towards the power semiconductor H side. Therefore, when the contact body 2 is pressed onto the plurality of electrically-conductive springs 32, the tapered part 2a of the side surface of the contact body 2 contacts with the tapered part 161a of the side surface of the opening 161 of the second latching plate 16, and the contact body 2 is latched onto the second latching plate 16 as a result of pressing by the plurality of electrically-conductive springs 32.

The surface 2f of the contact body 2 in this latched state projects more than the second latching plate 16, and is set to a state where the contact body 2 can initially contact with the power semiconductor H first.

Thereby, the contact body 2 is held so that it can rock, between the plurality of electrically-conductive springs 32 and the second latching plate 16 such that the entire surface of the contact body 2 surface-contacts with the surface of the power semiconductor H uniformly.

The guiding body 17 is disc-shaped and a plurality of through-holes 171 that pass through in the thickness direction are formed in the guiding body 17. The plurality of electrically-conductive springs 32 that press the contact body 2 from the back surface 2b are respectively inserted into the plurality of through-holes 171. Preferably, the plurality of through-holes 171 are arranged at the same position as the electrically-conductive springs 32 and the inner surface is formed to have a smooth surface such that the electrically-conductive springs 32 can move inside the through-hole 171 smoothly.

The substrate 6 is disc-shaped and is somewhat larger than the guiding body 17. The substrate 6 fixes the base end portion of the plurality of electrically-conductive springs 32. The bottom end 32c of the base end portion of the electrically-conductive springs 32 projects from the back surface 6b side of the substrate 6 and is connected to a current supply source (not illustrated).

The substrate 6 is connected to a cylinder (not illustrated) which is arranged at the back side and the cylinder presses the probe device 1a onto the power semiconductor H.

The gate terminal 8 is provided in the substrate 6 independently from the electrically-conductive springs 32. The gate terminal 8 inputs signals for performing on and off control of the power semiconductor H to the power semiconductor H.

The gate terminal 8 has an expanding and contracting function as in the electrically-conductive springs 32 and projects to the extremity side of the probe device 1a similar to the contact body 2. The gate terminal 8 is connected to a signal circuit (not illustrated), and when the contact body 2 presses the power semiconductor H, the gate terminal 8 itself contacts with the power semiconductor H similarly to enable input of the signal voltage, and performs on and off control of the power semiconductor H.

The substrate 6, the guiding body 17 and the second latching plate 16 include: two second bolt holes 63, 172 and 163 provided around the center region where the contact body 2 is arranged; and a second bolt 10a inserted into the second bolt holes 63, 172 and 163. By using such components, the guiding body 17 and the second latching plate 16 are fixed with spacing in between and the substrate 6 is fixed; and the spatial relationship between the guiding body 17 and the second latching plate 16 is aligned.

The substrate 6 and the guiding body 17 include: three third bolt holes 64, 173 provided around the center region where the contact body 2 is arranged, and a third bolt 10b which is inserted into the third bolt holes 64, 173.

Since the guiding body 17 and the second latching plate 16 are fixed by the second bolt 10a, and the substrate 6 and the guiding body 17 are fixed by the third bolt 10b, the contact body 2 is replaceable by removing the second and third bolts 10a and 10b.

The probe device 1a according to the present embodiment described above has the same advantageous effects (1)-(5) as the above-described embodiment.

Third Embodiment

In a third embodiment, although the structure of a probe device 1b is different from the first embodiment, since other parts are the same, a characterizing portion will be described and a descriptions of similar components will be omitted.

Figures 6A, 6B:
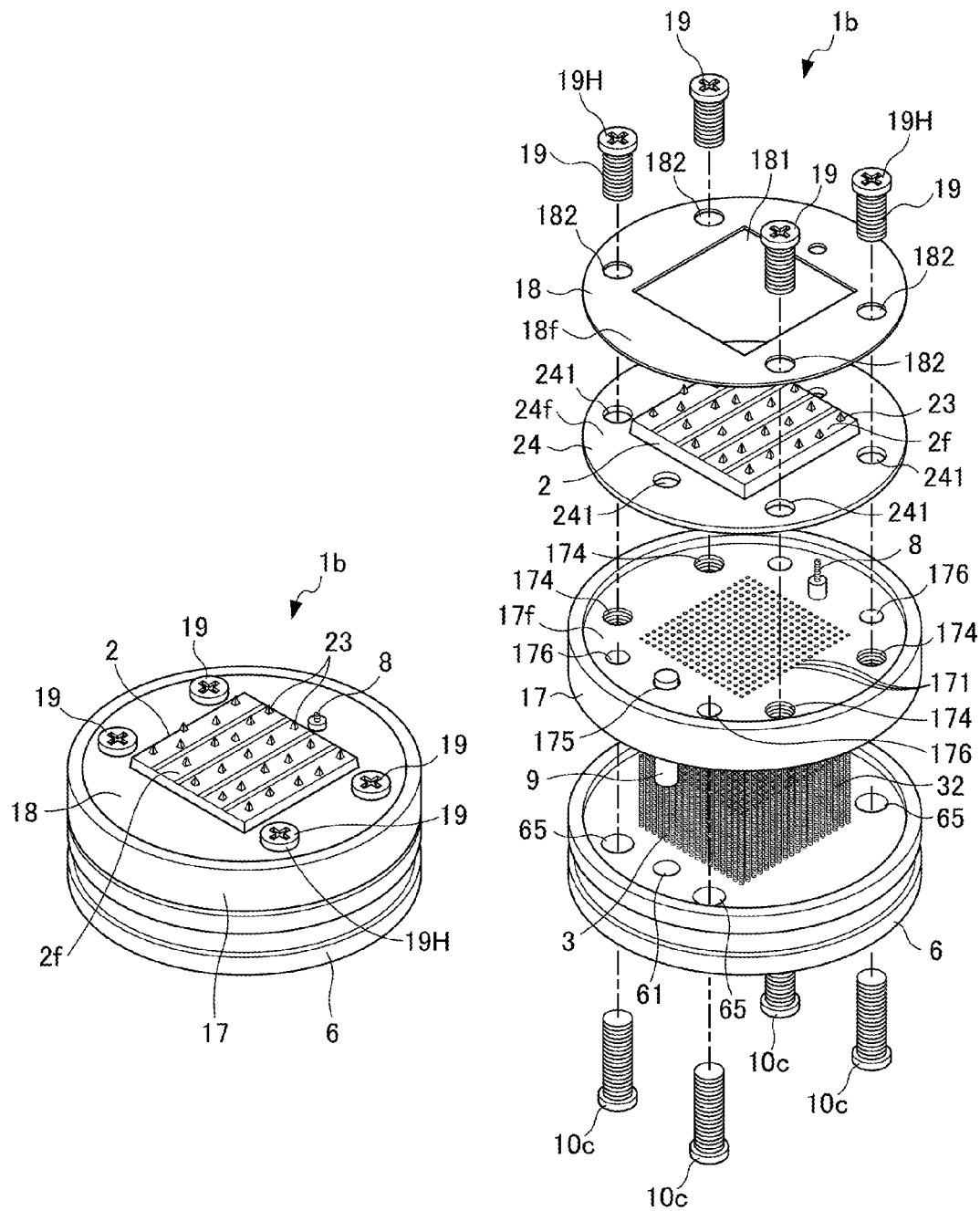
FIGS. 6A and 6B are perspective views showing a schematic structure of a probe device according to a third embodiment of the present invention.

FIGS. 6A and 6B are perspective views showing a schematic structure of the probe device 1b according to the present embodiment. FIG. 6A is an overall view and FIG. 6B is an exploded view.

The probe device 1b includes a contact body 2, a pressing body 3, an insulating plate 18, a guiding body 17, and a substrate 6.

The contact body 2 is installed in the center region of a disc-shaped underplate 24. The contact body 2 on the underplate 24 is formed in a quadrangular shape somewhat smaller than a power semiconductor H of quadrangular shape, and has a surface 2f that surface-contacts with the power semiconductor H.

The contact body 2 includes: a nickel layer 21 (surface layer) having a surface 2f that contacts with the power semiconductor H; and a copper layer 22 (supporting layer) which has a back surface 2b that contacts with the pressing body 3 and supports the nickel layer 21. Here, since copper is a metal that is softer than nickel, the copper layer 22 is more flexible than the nickel layer 21.

The contact body 2 has a plurality of microscopic projections 23 that are inserted into only the surface electrode layer on the surface layer of the power semiconductor H on the surface 2f that contacts with the power semiconductor H. Although the contact body 2 has a plurality of microscopic projections 23, the surface 2f is a flat surface larger than the plurality of microscopic projections 23.

The pressing body 3 has a separate body from the contact body 2 and includes: electrically-conductive springs 32 which are a plurality of electrically-conductive elastic bodies (multiple parts). An extremity surface 32t of the electrically-conductive springs 32 is configured to contact with the back surface 2b of the contact body 2, and allow movement of the contact position. The electrically-conductive springs 32 are arranged at equal intervals on the back surface 2b of the contact body 2 in an XY plane direction and apply a pressing force F to each of a plurality of sections of the contact body 2.

It should be noted that, although the electrically-conductive springs 32 having electrical conductivity are used in all of the electrically-conductive springs 32 in the present embodiment, only a part of the springs of the pressing body 3 may have electrical conductivity when there is enough electricity conducted by the pressing body 3. For example, in the plurality of springs which are arranged adjacently to serve as the pressing body 3, springs that have electrical conductivity and springs that do not have electrical conductivity may be arranged alternately one by one.

In addition, if electricity for electrifying the contact body 2 is not enough by merely making the spring of the pressing body 3 electrically-conductive, flexible wiring may be provided separately to electrify the contact body 2 directly.

An insulating plate 18 is disc-shaped and is located at the extremity of the probe device 1b when the probe device 1b is installed.

There is an opening 181 in the center region of a surface 18f of the insulating plate 18. The insulating plate 18 covers a surface exposed part 24f of the underplate 24 where the contact body 2 is installed, and meanwhile projects the contact body 2 to the power semiconductor H side by the opening 181.

The guiding body 17 is disc-shaped and a plurality of through-holes 171 that pass through in the thickness direction are formed in the guiding body 17. Each of the plurality of electrically-conductive springs 32 that presses the contact body 2 from the back surface 2b is inserted into the plurality of through-holes 171. Preferably, the plurality of through-holes 171 are arranged at the same position as the electrically-conductive springs 32 and the inner surface is smoothly formed such that the electrically-conductive springs 32 can move smoothly inside the through-holes 171.

The guiding body 17, the underplate 24 and the insulating plate 18 are installed by the installation bolts 19 being inserted into four installation bolt holes 174, 241 and 182 which are provided around the contact body 2, and the head part 19H of the installation bolt 19 being made loose with respect to the surface 17f of the guiding body 17.

Thereby, the contact body 2 is held so that it can rock, by being pressed by the electrically-conductive springs 32 to the head part 19H of the installation bolt 19 together with the underplate 24 and the insulating plate 13.

Since the head part 19H of the installation bolt 19 is thin, the contact body 2 that is pressed to the head part 19H of the installation bolt 19 projects from the head part 19H.

Since the guiding body 17, the underplate 24 and the insulating plate 18 are fixed with the installation bolt 19, the contact body 2 is replaceable by removing the installation bolt 19.

The substrate 6 is disc-shaped and is somewhat larger than the guiding body 17. The substrate 6 fixes the base end portion of the plurality of electrically-conductive springs 32. The bottom end 32c of the base end portion of the electrically-conductive springs 32 projects from the back surface 6b side of the substrate 6 and is connected to a current supply source (not illustrated).

The substrate 6 is connected to a cylinder (not illustrated) which is arranged at the back side and the cylinder presses the probe device 1b onto the power semiconductor H.

A gate terminal 8 is provided in the substrate 6 independently from the electrically-conductive springs 32. The gate terminal 8 inputs signals for performing on and off control of the power semiconductor H to the power semiconductor H.

The gate terminal 8 has an expanding and contracting function as in the electrically-conductive springs 32 and projects to the extremity side of the probe device 1b similar to in the contact body 2. The gate terminal 8 is connected to a signal circuit (not illustrated), and when the contact body 2 presses the power semiconductor H, the contact body 2 itself contacts with the power semiconductor H similarly to enable input of the signal voltage, and performs on and off control of the power semiconductor H.

The substrate 6, the guiding body 17 and the underplate 24 include: one alignment bolt holes 61, 175, 242, provided around the center region where the contact body 2 is arranged; and an alignment bolt 9 that is inserted into the alignment bolt holes 61, 175, 242, and the spatial relationship among the substrate 6, the guiding body 17, and the underplate 24 is aligned using the holes and the bolt.

The substrate 6 and the guiding body 17 include: four fourth bolt holes 65, 176 provided around the center region where the contact body 2 is arranged, and fourth bolt holes 65, 176 that are inserted into the fourth bolt holes 65 and 176; and the substrate 6 and the guiding body 17 are fixed with spacing in between using the bolt holes and the bolts.

According to the probe device 1b according to the present embodiment described above, there are advantageous effects (1)-(5) similar to the above-described embodiment.

It should be noted that the present invention is not limited to the above-described embodiments, and modifications, improvements, and the like are included in the scope of the invention where modifications, improvements, or the like are carried out within a scope in which an object of the present invention can be achieved.

What is claimed is:

1. A current applying device for applying current by being in pressure-contact with an inspection target body, comprising:
   a contact body which surface-contacts with the inspection target body;
   a pressing body which presses the contact body to the inspection target body; and
   a latching plate which latches the contact body on side faces thereof;
   wherein the contact body and the pressing body are separate bodies,
   whereby the contact body is movably held between the pressing body and the latching plate so that the contact body is configured to rock, such that an entire surface of the contact body surface-contacts with a surface of the inspection target body uniformly,
   the pressing body electrifies the contact body while providing pressing force to each of a plurality of sections of the contact body, and
   wherein the contact body and the latching plate are formed such that side surfaces of both the inner portion of the latching plate and the outer portion of contact body are formed to have tapered parts, tapering towards the surface of the inspection target body side.

2. The current applying device according to claim 1, wherein the pressing body includes a plurality of electrically-conductive elastic bodies.

3. The current applying device according to claim 1, wherein
   the contact body includes a surface layer that contacts with the inspection target body, and
   a supporting layer that supports the surface layer, and the supporting layer is more flexible than the surface layer.

4. The current applying device according to claim 1, wherein the contact body has microscopic projections that are inserted into only a surface layer of the inspection target body, on a surface that contacts with the inspection target body.

5. The current applying device according to claim 4, wherein the contact body having the microscopic projections is manufactured by electroforming using a mold in which depressions corresponding to the microscopic projections are formed on a surface.

6. The current applying device according to claim 4, wherein height of the microscopic projections from the surface of the contact body is smaller than film thickness of a surface electrode layer formed on a surface of a power semiconductor that is an inspection target body.

7. The current applying device according to claim 6, wherein the surface of the contact body has a regulating surface which regulates introduction of the microscopic projections into the surface electrode layer.

* * * * *